United States Patent
DeMuth et al.

(10) Patent No.: US 11,745,425 B2
(45) Date of Patent: *Sep. 5, 2023

(54) ENCLOSED ADDITIVE MANUFACTURING SYSTEM

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 296 days.

This patent is subject to a terminal disclaimer.

(21) Appl. No.: 17/076,144

(22) Filed: Oct. 21, 2020

(65) Prior Publication Data
US 2021/0053123 A1  Feb. 25, 2021

Related U.S. Application Data

(63) Continuation of application No. 15/336,465, filed on Oct. 27, 2016, now Pat. No. 10,843,265.

(Continued)

(51) Int. Cl.
*B29C 64/264* (2017.01)
*B29C 64/153* (2017.01)
(Continued)

(52) U.S. Cl.
CPC .............. *B29C 64/264* (2017.08); *B22F 3/24* (2013.01); *B22F 10/00* (2021.01); *B22F 10/28* (2021.01); *B22F 10/34* (2021.01); *B22F 10/36* (2021.01); *B22F 10/70* (2021.01); *B22F 12/00* (2021.01); *B22F 12/226* (2021.01); *B22F 12/30* (2021.01); *B22F 12/33* (2021.01); *B22F 12/38* (2021.01); *B22F 12/44* (2021.01); *B22F 12/70* (2021.01); *B22F 12/88* (2021.01); *B22F 12/90* (2021.01); *B23K 15/002* (2013.01);
(Continued)

(58) Field of Classification Search
CPC ... B29C 64/153; B28B 1/001; B23K 15/0086; B23K 26/0006; Y02P 10/25; B33Y 30/00; B22F 12/38; B22F 12/70
See application file for complete search history.

(56) References Cited

U.S. PATENT DOCUMENTS

| 10,843,265 | B2 * | 11/2020 | DeMuth | B22F 12/90 |
| 2005/0280185 | A1 * | 12/2005 | Russell | B29C 64/165 |
| | | | | 425/375 |
| 2014/0265049 | A1 * | 9/2014 | Burris | B22F 12/90 |
| | | | | 264/497 |

\* cited by examiner

Primary Examiner — Joseph S Del Sole
Assistant Examiner — Jamel M Nelson
(74) Attorney, Agent, or Firm — David R. Stevens; Stevens Law Group

(57) ABSTRACT

A method of additive manufacture is disclosed. The method may include restricting, by an enclosure, an exchange of gaseous matter between an interior of the enclosure and an exterior of the enclosure. The method may further include running multiple machines within the enclosure. Each of the machines may execute its own process of additive manufacture. While the machines are running, a gas management system may maintain gaseous oxygen within the enclosure at or below a limiting oxygen concentration for the interior.

6 Claims, 11 Drawing Sheets

Related U.S. Application Data

(60) Provisional application No. 62/248,776, filed on Oct. 30, 2015, provisional application No. 62/248,765, filed on Oct. 30, 2015, provisional application No. 62/248,795, filed on Oct. 30, 2015, provisional application No. 62/248,829, filed on Oct. 30, 2015, provisional application No. 62/248,968, filed on Oct. 30, 2015, provisional application No. 62/248,989, filed on Oct. 30, 2015, provisional application No. 62/248,847, filed on Oct. 30, 2015, provisional application No. 62/248,799, filed on Oct. 30, 2015, provisional application No. 62/248,787, filed on Oct. 30, 2015, provisional application No. 62/248,770, filed on Oct. 30, 2015, provisional application No. 62/248,848, filed on Oct. 30, 2015, provisional application No. 62/248,841, filed on Oct. 30, 2015, provisional application No. 62/248,783, filed on Oct. 30, 2015, provisional application No. 62/248,969, filed on Oct. 30, 2015, provisional application No. 62/248,839, filed on Oct. 30, 2015, provisional application No. 62/248,980, filed on Oct. 30, 2015, provisional application No. 62/248,758, filed on Oct. 30, 2015, provisional application No. 62/248,821, filed on Oct. 30, 2015, provisional application No. 62/248,835, filed on Oct. 30, 2015, provisional application No. 62/248,791, filed on Oct. 30, 2015, provisional application No. 62/248,966, filed on Oct. 30, 2015, provisional application No. 62/248,780, filed on Oct. 30, 2015, provisional application No. 62/248,833, filed on Oct. 30, 2015.

(51) Int. Cl.

| | | |
|---|---|---|
| *B33Y 10/00* | (2015.01) | |
| *B33Y 40/00* | (2020.01) | |
| *B33Y 50/02* | (2015.01) | |
| *B33Y 70/00* | (2020.01) | |
| *B33Y 80/00* | (2015.01) | |
| *B33Y 99/00* | (2015.01) | |
| *B23K 26/12* | (2014.01) | |
| *B23K 26/142* | (2014.01) | |
| *B23K 26/144* | (2014.01) | |
| *B23K 26/70* | (2014.01) | |
| *B29C 64/386* | (2017.01) | |
| *B29C 64/268* | (2017.01) | |
| *B22F 3/24* | (2006.01) | |
| *B23K 15/00* | (2006.01) | |
| *B23K 15/06* | (2006.01) | |
| *B23K 26/03* | (2006.01) | |
| *B23K 26/08* | (2014.01) | |
| *B23K 26/16* | (2006.01) | |
| *B23K 26/36* | (2014.01) | |
| *B23K 37/04* | (2006.01) | |
| *B25J 11/00* | (2006.01) | |
| *G02B 7/14* | (2021.01) | |
| *G02B 7/16* | (2021.01) | |
| *G02B 7/182* | (2021.01) | |
| *G02B 15/04* | (2006.01) | |
| *G02B 15/10* | (2006.01) | |
| *G02B 19/00* | (2006.01) | |
| *G02F 1/01* | (2006.01) | |
| *G02F 1/1333* | (2006.01) | |
| *G02F 1/135* | (2006.01) | |
| *G05B 17/02* | (2006.01) | |
| *H01S 5/40* | (2006.01) | |
| *B22F 10/00* | (2021.01) | |
| *H01S 5/00* | (2006.01) | |
| *B22F 12/33* | (2021.01) | |
| *B22F 12/44* | (2021.01) | |
| *B22F 12/70* | (2021.01) | |
| *B22F 12/00* | (2021.01) | |
| *G02B 27/10* | (2006.01) | |
| *B22F 10/28* | (2021.01) | |
| *B22F 10/70* | (2021.01) | |
| *B22F 12/30* | (2021.01) | |
| *B22F 12/88* | (2021.01) | |
| *B22F 12/90* | (2021.01) | |
| *B22F 10/34* | (2021.01) | |
| *B22F 10/36* | (2021.01) | |
| *G02B 26/08* | (2006.01) | |
| *B23K 26/00* | (2014.01) | |
| *B23K 26/082* | (2014.01) | |
| *B23K 101/00* | (2006.01) | |
| *B23K 101/24* | (2006.01) | |
| *B23K 103/00* | (2006.01) | |
| *B23K 101/02* | (2006.01) | |
| *B29K 105/00* | (2006.01) | |
| *G02B 27/28* | (2006.01) | |
| *G07C 3/14* | (2006.01) | |
| *B22F 10/73* | (2021.01) | |
| *B22F 12/17* | (2021.01) | |
| *B22F 12/20* | (2021.01) | |
| *B22F 12/41* | (2021.01) | |
| *B22F 12/45* | (2021.01) | |
| *B22F 12/53* | (2021.01) | |
| *B22F 10/47* | (2021.01) | |
| *B22F 10/32* | (2021.01) | |
| *B22F 10/50* | (2021.01) | |
| *B22F 10/64* | (2021.01) | |
| *B22F 10/10* | (2021.01) | |
| *B33Y 30/00* | (2015.01) | |
| *B23K 26/342* | (2014.01) | |
| *B28B 1/00* | (2006.01) | |
| *G02B 27/09* | (2006.01) | |
| *G02B 27/14* | (2006.01) | |
| *G02B 27/00* | (2006.01) | |

(52) U.S. Cl.
CPC ...... *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/108* (2013.01); *G02F 1/0136* (2013.01); *G02F 1/135* (2013.01);

*G02F 1/133362* (2013.01); *G05B 17/02* (2013.01); *H01S 5/005* (2013.01); *H01S 5/4012* (2013.01); *B22F 10/10* (2021.01); *B22F 10/32* (2021.01); *B22F 10/47* (2021.01); *B22F 10/50* (2021.01); *B22F 10/64* (2021.01); *B22F 10/73* (2021.01); *B22F 12/17* (2021.01); *B22F 12/20* (2021.01); *B22F 12/222* (2021.01); *B22F 12/41* (2021.01); *B22F 12/45* (2021.01); *B22F 12/53* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 37/0408* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

ENCLOSED ADDITIVE MANUFACTURING SYSTEM

CROSS-REFERENCE TO RELATED PATENT APPLICATION

The present disclosure is part of a continuation of U.S. patent application Ser. No. 15/336,465, filed Oct. 27, 2016 and claiming the priority benefit of the below-listed provisional applications.

U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to additive manufacturing and, more particularly, to powder bed fusion additive manufacturing chamber designs with high throughput capabilities.

BACKGROUND

Traditional component machining often relies on removal of material by drilling, cutting, or grinding to form a part. In contrast, additive manufacturing, also referred to as three-dimensional (3D) printing, typically involves sequential layer-by-layer addition of material to build a part. In view of the current state of the art in 3D printing, what is needed are systems and methods for controlling the environment around 3D printing machines.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

This disclosure describes a method of additive manufacture that includes restricting, by an enclosure, an exchange of gaseous matter between an interior of the enclosure and an exterior of the enclosure. A plurality of machines supporting various additive manufacturing tasks, as well as pre- or post-processing tasks, can be located within the enclosure. At least one machine of the plurality of machines supports an independent process of additive manufacture. This independent process can include directing a two-dimensional patterned energy beam at a powder bed. To reduce problems with unwanted chemical reactions, a gas management system maintains gaseous oxygen within the enclosure at or below a limiting oxygen concentration for the interior during task execution.

Figure 1A:
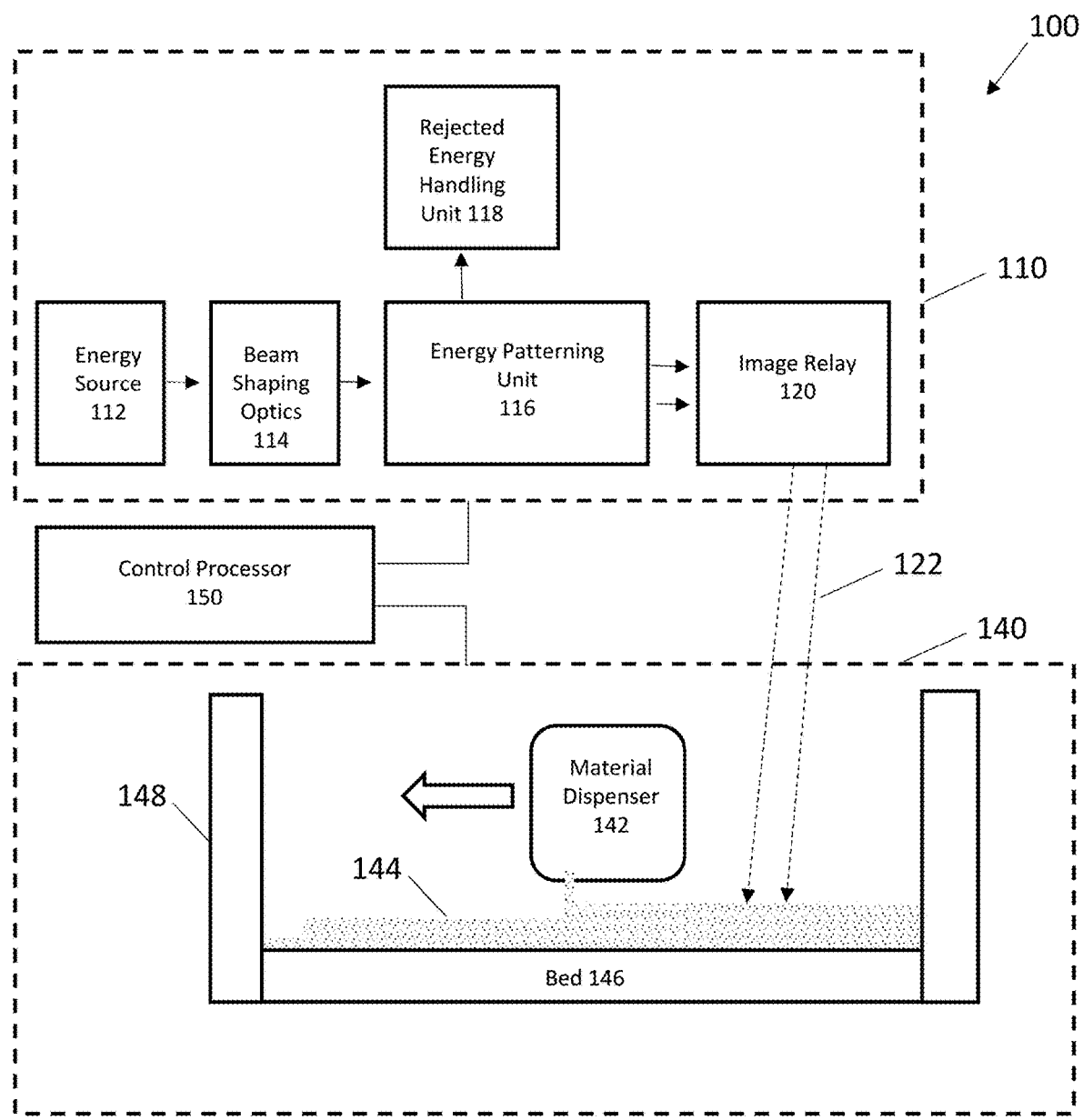
FIG. 1A illustrates an additive manufacturing system.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:YVO4) laser, Neodymium doped yttrium calcium oxoborateNd:$YCa_4O(BO_3)^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147$Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride(Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
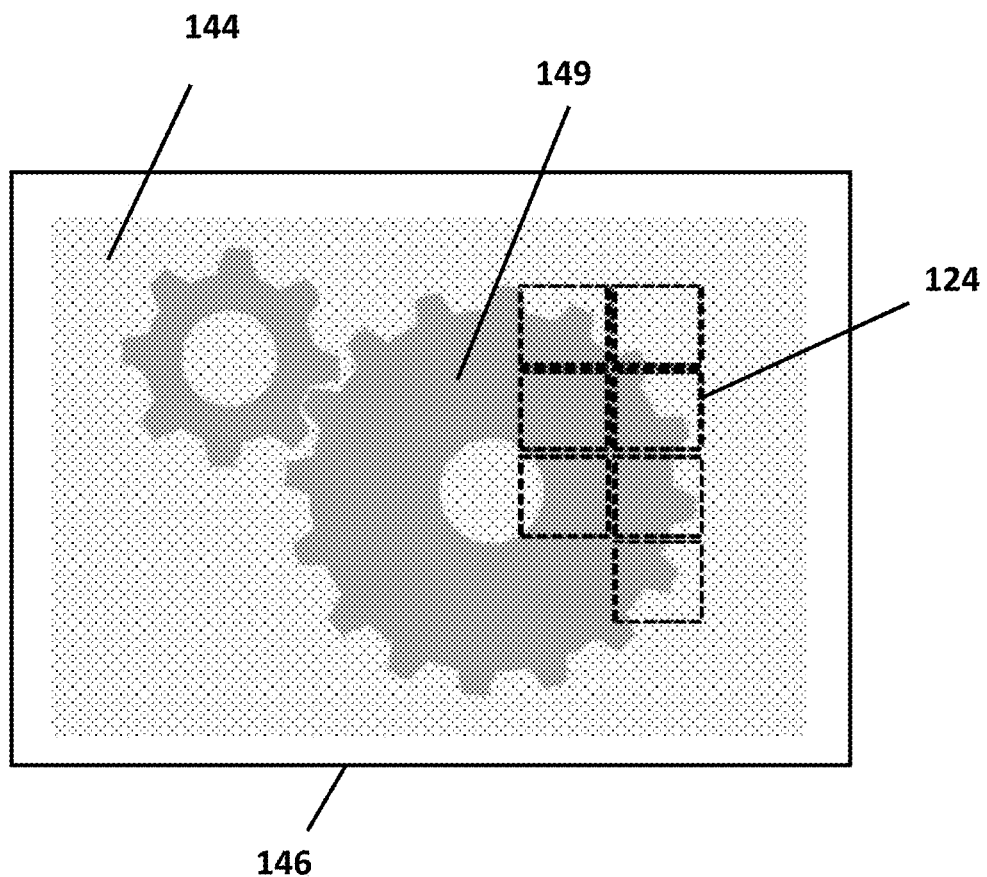
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
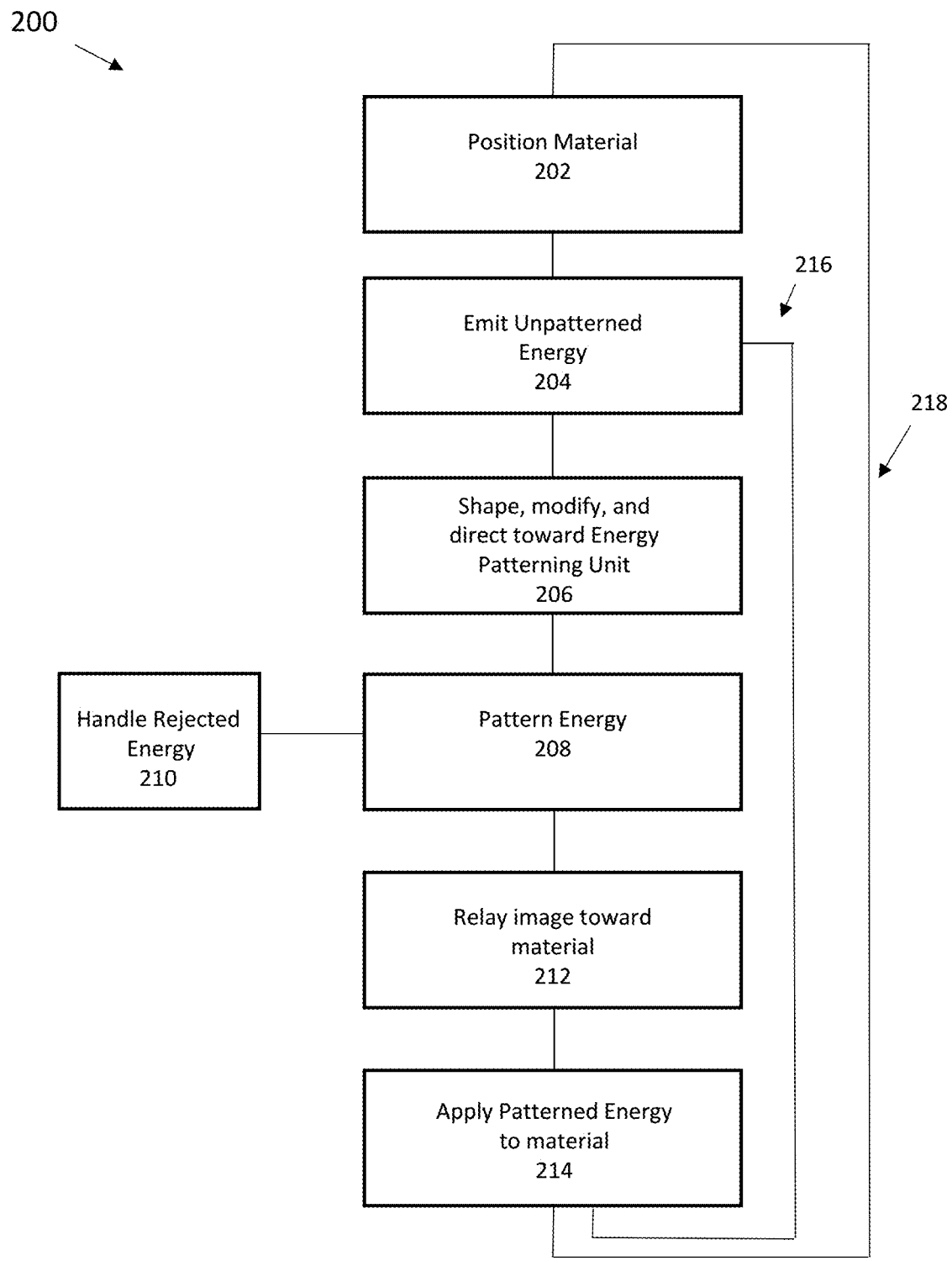
FIG. 2 illustrates an additive manufacturing method.

FIG. 2 is a flowchart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
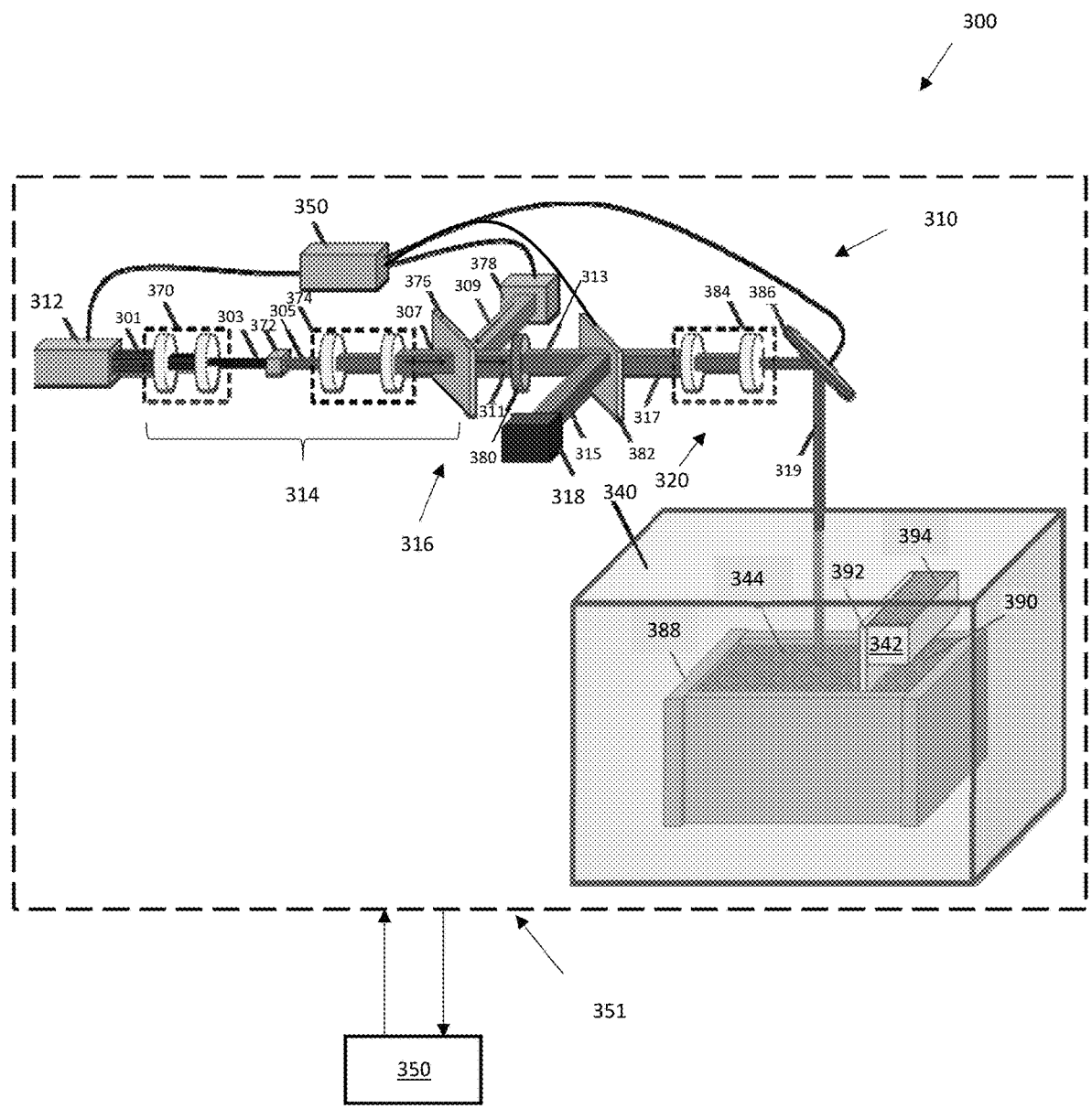
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light.

This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
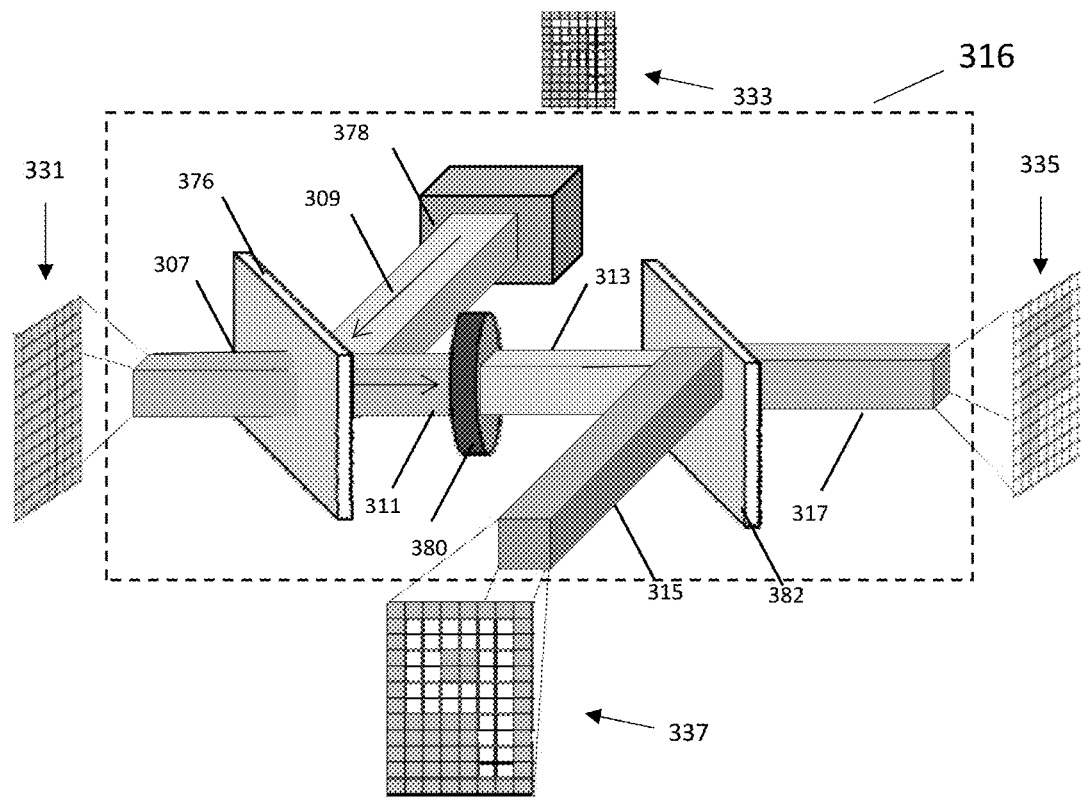
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
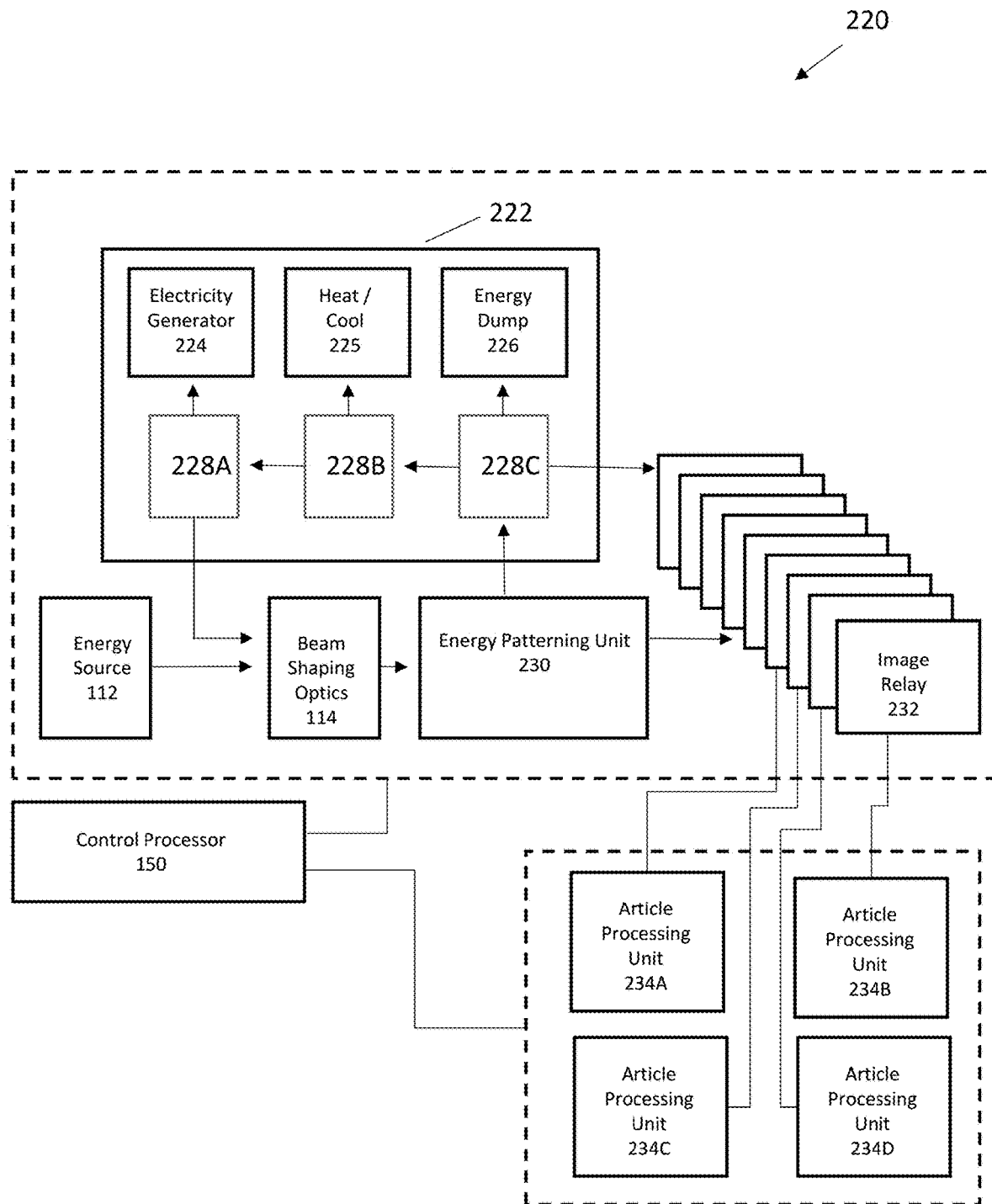
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
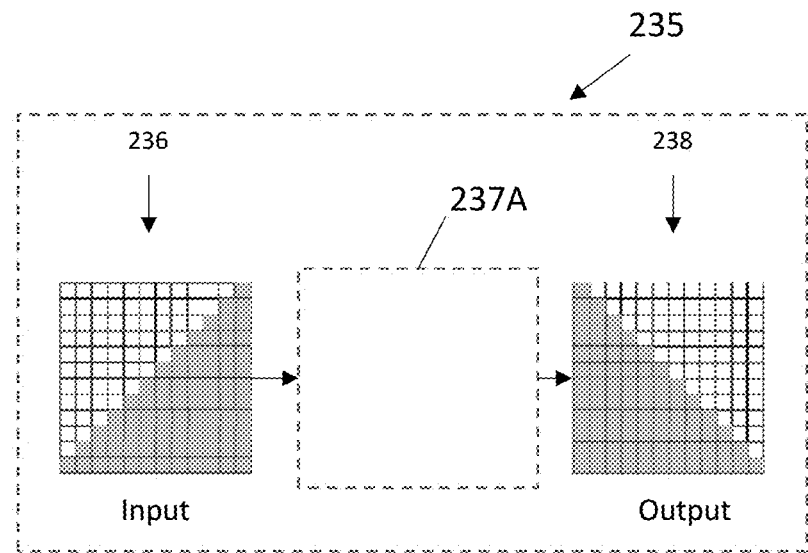
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
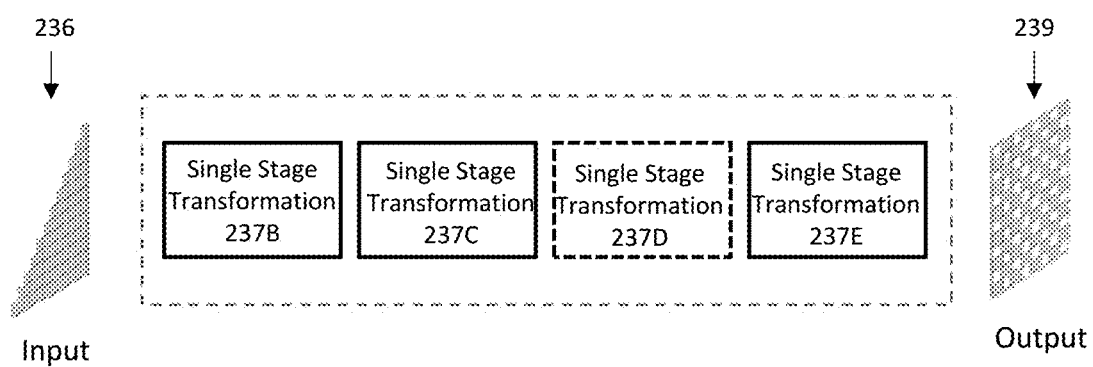
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
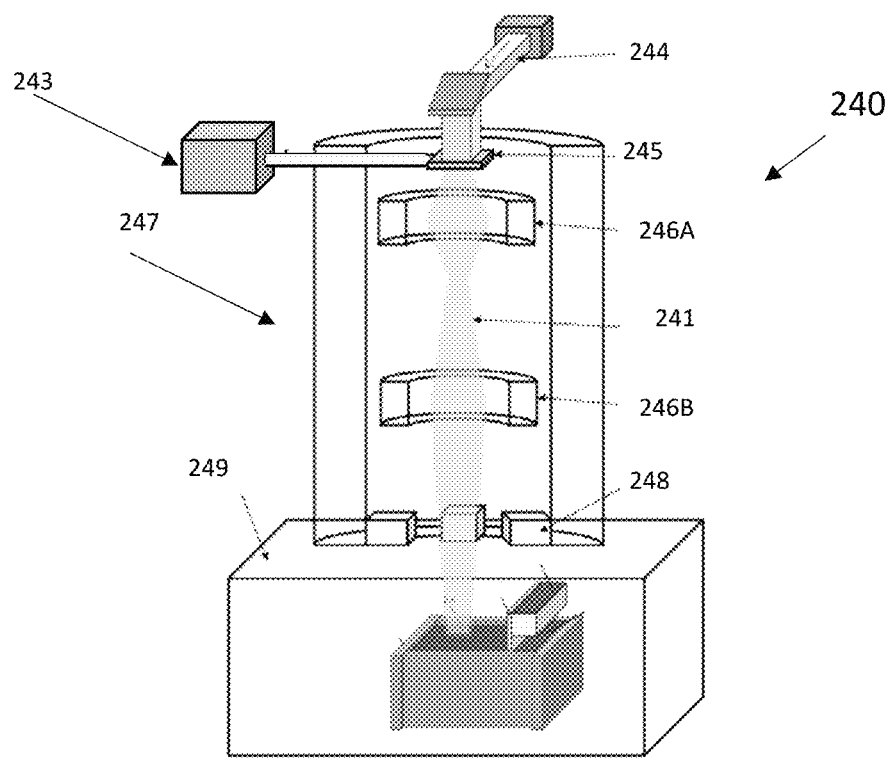
FIG. 3F illustrates an patternable electron energy beam additive manufacturing system.
Figure 3G:
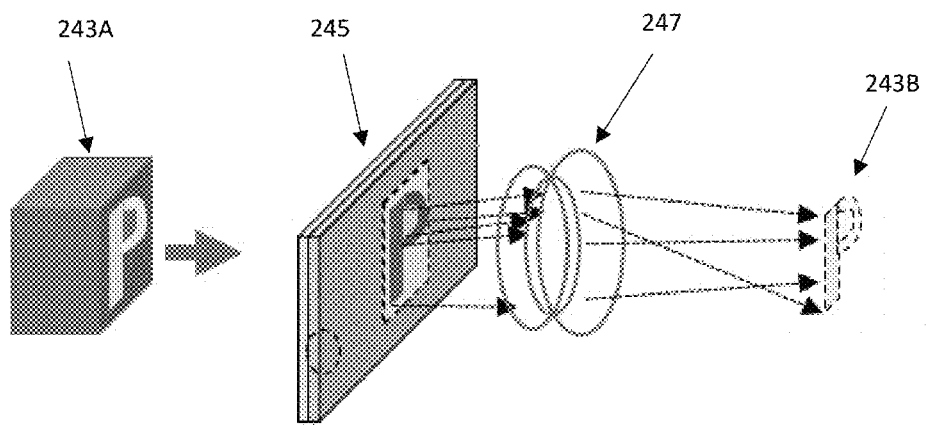
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than 0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
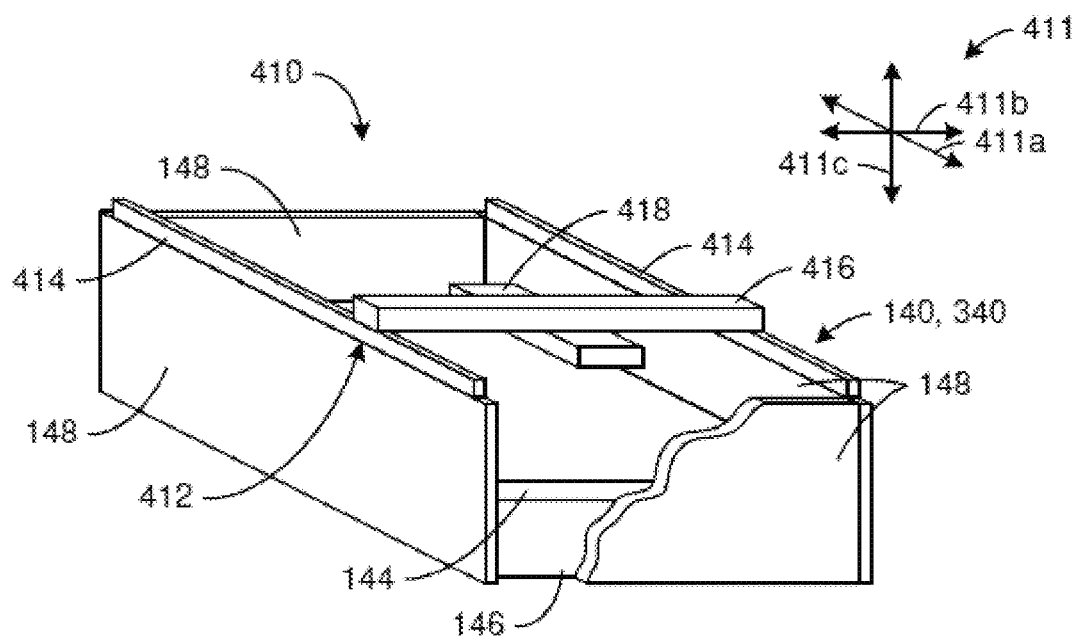
FIG. 4 is a perspective, partially cut-away, schematic diagram of one embodiment of a machine for executing a process of additive manufacture in accordance with the present invention.

Referring to FIG. 4, in selected embodiments, a machine 410 may be a device or system that executes a process of additive manufacture using components and systems such as previously discussed with at least some level of autonomy. For example, a machine 410 may be or comprise an additive manufacturing system 100, 300. In certain embodiments, the process of additive manufacture executed by a machine 410 may comprise powder bed fusion in the form of direct metal laser sintering (DMLS), electron beam melting (EBM), selective heat sintering (SHS), selective laser melting (SLM), selective laser sintering (SLS), or the like. In some embodiment, an additive manufacturing machine can mechanisms for directing a two-dimensional patterned energy beam at a powder bed, such as described with respect to FIG. 1 as described herein. At a manufacturing facility comprising multiple machines 410, the processes of additive manufacture executed by those multiple machines 410 may be independent of each other. Thus, different machines 410 may start their respective processes at different times, manufacture the same or different parts, and so forth.

In discussing machines 410 in accordance with the present invention, it may be helpful to define a uniform coordinate system 411. Accordingly, certain machines 410 may correspond to or define longitudinal, lateral, and transverse directions 411a, 411b, 411c orthogonal to one another. The longitudinal direction 411a may correspond to a long axis of a machine 410. The lateral direction 411b may combine with the longitudinal direction 411a to define a horizontal plane. That is, the longitudinal and lateral directions may both extend within a horizontal plane. The transverse direction 411b may extend up and down in alignment with gravity.

Machines 410 in accordance with the present invention may have any suitable configuration. For example, in selected embodiments, a machine 410 may comprise a powder-bed-fusion printer. Accordingly, a machine 410 may include an energy patterning system 110, 310, an article processing unit 140, 340 (e.g., a sub-assembly comprising a dispenser 142 for selectively distributing layers of granular material 144, a build platform 146 or bed 146 over which various layers of the granular material 144 may be distributed, various walls 148 positioned to contain and/or support the various layers of the granular material 144, or the like or a combination or sub-combination thereof), a controller 150, a gantry system 412, or the like or a combination or sub-combination thereof.

A gantry system 412 may include one or more longitudinal rails 414 extending in the longitudinal direction 411a, a carriage 416 selectively moving in the longitudinal direction 411a along the one or more longitudinal rails 414, one or more lateral rails (not shown) forming part of the carriage 416, and a print head 418 selectively moving in the lateral direction 411b along the one or more lateral rails. A print head 418 may comprise an energy patterning system 110, 310 or some portion thereof. Relative motion in the transverse direction 411c between a print head 418 and a bed 146 (e.g., motion to accommodate new layers of granular material 144 as they are laid down on a bed 146) may be accomplished by incrementally moving the print head 418 away from the bed 146, incrementally moving the bed 146 away from the print head 418, or some combination thereof.

A machine 410 in accordance with the present invention may have any suitable size. For example, the bed 146 of a machine 410 may extend from about 0.5 to over 12 meters in the longitudinal and/or lateral directions 411a, 411b. Relative motion between a print head 418 and a bed 146 and the sizing of various walls 148 may accommodate a buildup of granular material 144 from about 0.5 to over 3 meters.

Figure 5:
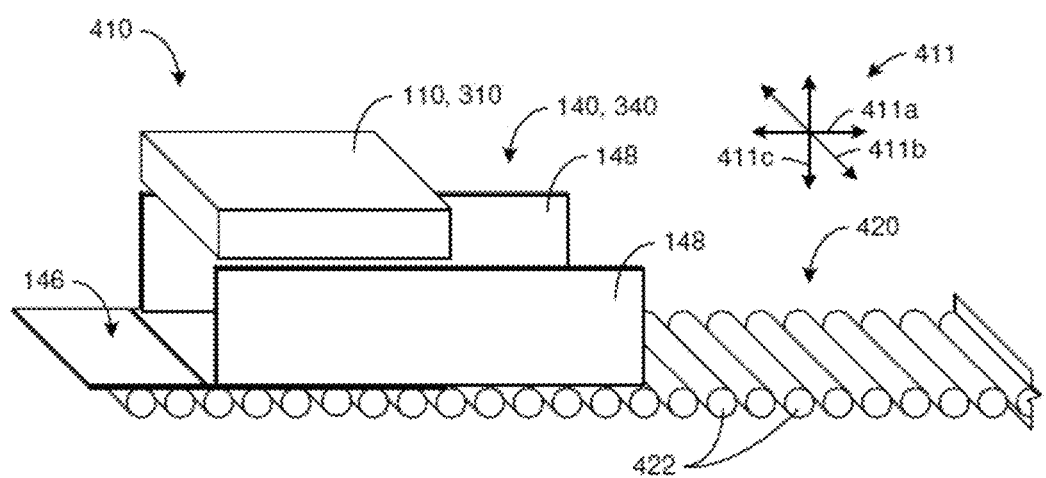
FIG. 5 is a perspective, partially cut-away, schematic diagram of an alternative embodiment of a machine for executing a process of additive manufacture in accordance with the present invention.

Referring to FIG. 5, in selected embodiments, a machine 410 in accordance with the present invention may enable or support substantially continuous additive manufacture of parts that are long (e.g., continuous parts that are longer in the longitudinal direction 411a than the machine 410 can print in its printing range of motion). This may be accomplished by manufacturing a part in segments.

For example, in certain embodiments, a machine 410 in accordance with the present invention may (1) manufacture a first segment of a part, (2) advance the part a selected distance down a conveyor 420, (3) manufacture a second segment of the part, (4) advance the part a selected distance down the conveyor 420, and (5) repeat until all segments of the part have been completed. In this manner, additive manufacture and clean-up (e.g., separation and/or reclamation of unused or unamalgamated granular material 144) may be performed in parallel (i.e., at the same time) at different locations or zones on the conveyor 420. Thus, additive manufacture in accordance with the present invention need not stop for removal of granular material 144 and/or parts.

In such embodiments, a bed 146 may form part of, be supported by, and/or ride on a conveyor 420. A conveyor 420 may comprise one or more powered rollers 422 that rotate as directed by a controller 150. Alternatively, a conveyor 420 may comprise a belt extending around a plurality of rollers 422, one or more of which may be powered and rotate as directed by a controller 150. However, regardless of the configuration of a conveyor 420, an energy patterning system 110, 310 or selected components thereof may be configured to move incrementally in the transverse direction 411c with respect to the conveyor 420. That is, a machine 410 may include a bed 146 that is fixed in the lateral and transverse directions 411b, 411c and a print head 418 that indexes (e.g., incrementally moves) in the transverse direction 411c to change the focal point to accommodate new (i.e., higher) layers of material as they are laid down on the bed 146.

As a granular material 144 is laid down, layer after layer, it may be necessary to contain the granular material 144 so that is does not move, shift, fall away from a part 410, or the like during additive manufacture. Accordingly, a machine may include one or more walls 148. Certain walls 148 may be stationary. That is, they may not move with a conveyor 420. Other walls 148 may be traveling walls 148 that move with a conveyor 420. For example, in selected embodiments, two stationary walls 148 may block granular material 144 from falling off the sides of a conveyor 420 in a lateral direction 411b, while two or more traveling walls 148 may contain the granular material 144 in the longitudinal direction 411a.

After a completed segment of a part has been advanced down a conveyor 420, a new process of additive manufacture may have a "clean slate" to begin creating the next segment of the part. This new process may include amalgamating selected granules to a near or trailing side of a traveling wall 148, thereby maintaining the longitudinal continuity (i.e., the continuous structural connection in the lateral direction 411a between a segment that is currently being formed and all previously formed segments) of the part. Thus, certain traveling walls 148 may form the boundaries between the various segments of a part. Moreover, such traveling walls 148 may intersect any part that spans them. Accordingly, before a part is ready to use, selected portions of such walls 148 may need to be removed (e.g., broken off, cut off, ground off, or the like) from the part.

Thus, a machine 410 in accordance with the present invention may define or include multiple zones. Different tasks may be performed in different zones. In selected embodiments, different zones may correspond to different locations along a conveyor 420. Accordingly, a conveyor 420 may advance a part through the various zones of a machine 410.

In certain embodiments, a machine 410 may include three zones. A first zone may correspond to, include, or span the portion of a conveyor 420 where additive manufacture occurs. Thus, a first zone may correspond to the area on a conveyor 420 where the various layers of granular material 144 are being laid down and granular material 144 is being maintained in intimate contact with a part.

A second zone may directly follow a first zone. A second zone may be characterized by a significant portion of the unamalgamated portion of a granular material 144 moving away from a part. For example, in a second zone, one or more walls 148 (e.g., stationary walls 148) may terminate so that the unamalgamated portion of a granular material 144 may no longer be fully contained in the lateral direction 411b. As a result, some of the unamalgamated portion of a granular material 144 may spill off the sides of a conveyor 420. The spilling granular material 144 may fall into one or more containers where it may be collected and reused.

In certain embodiments, some of the unamalgamated portion of a granular material 144 may not "drain" off of a conveyor 420. Accordingly, within a second zone, this remainder of the granular material 144 may be removed, cleaned-up, or the like in any suitable manner. For example, a vacuum mechanism having a collection port that is controlled (e.g., moved) manually or robotically may be used to collect the remainder. Alternatively, or in addition thereto, one or more flows of pressurized gas that are controlled (e.g., aimed) manually or robotically may be used to dislodge the remainder from certain crevices, sweep the remainder off a conveyor 420, and/or move the remainder to one or more locations where it can be accessed by a vacuum.

A third zone may directly follow a second zone. A third zone may be characterized by a portion of a part within the third zone being exposed to view (e.g., completely, substantially, or partially exposed to view by the removal or movement of a significant portion of the unamalgamated portion of a granular material 144) without the part changing its position in the lateral and transverse directions 411b, 411c.

For example, in certain embodiments, a leading portion of a part may reach a third zone while a trailing portion of the part is still being manufactured within the first zone. Accordingly, in selected embodiments, a conveyor 420, a bed 146, one or more traveling walls 148, or the like or a combination or sub-combination thereof may cooperate to maintain a leading portion of a part in the same position in the lateral and transverse directions 411a, 411c as the leading portion occupied within the first zone and the second zone. Thus, the position of the leading portion of the part may not excessively disrupt, distort, or the like additive manufacture that is occurring on a trailing portion of the part in the first zone.

Accordingly, a machine 410 that enables or supports substantially continuous additive manufacture of parts that are long may itself be long. That is, the conveyor 420 of such a machine 410 may need to be longer than the longest part to the manufactured by the machine 410.

Figure 6:
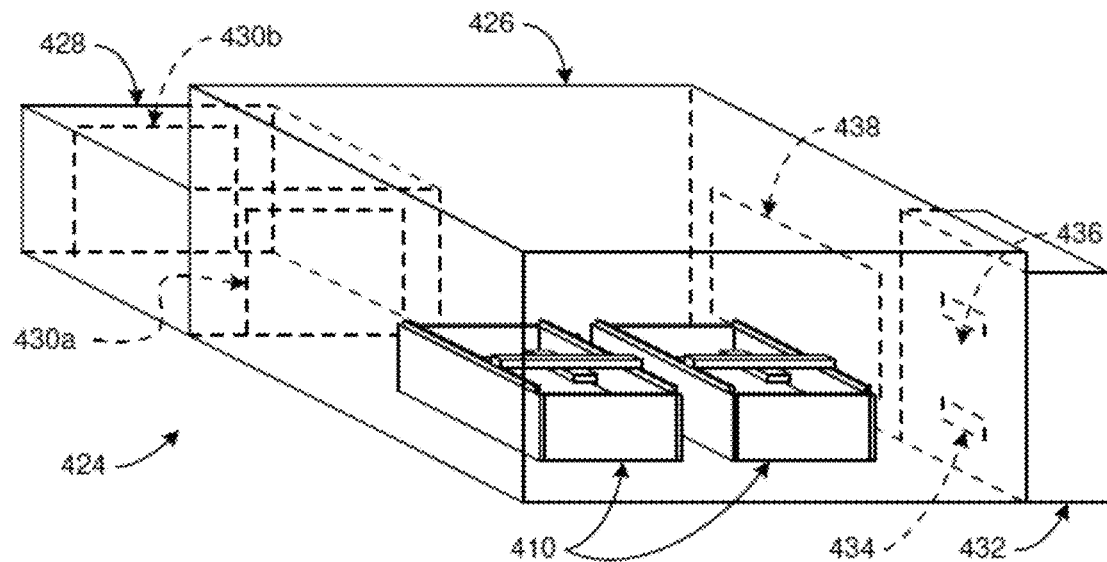
FIG. 6 is a perspective, schematic diagram of one embodiment of an enclosure for controlling a working environment surrounding multiple machines contained within the enclosure in accordance with the present invention.
Figure 7:
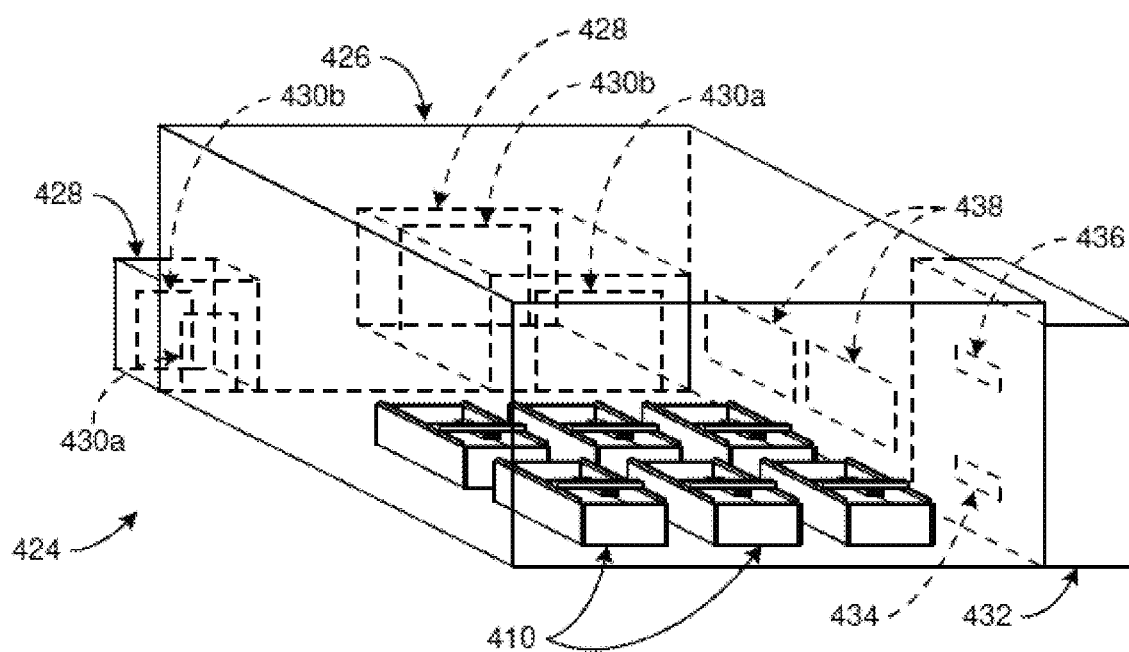
FIG. 7 is a perspective, schematic diagram of an alternative embodiment of an enclosure for controlling a working environment surrounding multiple machines contained within the enclosure in accordance with the present invention.

Referring to FIGS. 6 and 7, a manufacturing facility 424 in accordance with the present invention may comprise one or more machines 410 contained within an enclosure 426. Such an enclosure 426 may control one or more environmental conditions as desired or necessary. For example, an enclosure 426 may protect a printed or to-be-printed material from unwanted thermal, chemical, photonic, radiative, or electronic reactions or interactions or the like or combinations or sub-combinations thereof. An enclosure 426 may also protect human operators or other nearby personnel from potentially harmful aspects of a machine and machine powders 410 such as heat, UV light, chemical reactions, radioactive decay products, and laser exposure.

The one or more machines 410 contained within a particular enclosure 426 may all be the same size or of varying sizes. Similarly, the one or more machines 410 contained within a particular enclosure 426 may all be the same type or of varying types. For example, in selected embodiments, each of the one or more machines 410 within an enclosure 426 may amalgamate (e.g., unite, bond, fuse, sinter, melt, or the like) a particular granular material 144 in a batch process (e.g., in a process executed by a machine 410 corresponding to FIG. 4). In other embodiments, each of the one or more machines 410 within an enclosure 426 may amalgamate a particular granular material 144 in a continuous process (e.g., in a process executed by a machine 410 corresponding to FIG. 5). In still other embodiments, one or more machines 410 within an enclosure 426 may amalgamate a particular granular material 144 in a batch process, while one or more other machines 410 within the enclosure 426 may amalgamate the particular granular material 144 in a continuous process.

One or more machines 410 may be arranged in an enclosure 426 so that sufficient space around the machines 410 is preserved for one or more human workers, robots, or the like to access the machines 410, remove parts therefrom, vacuum up unamalgamated granular material 144 for reuse, or the like. Alternatively, or in addition thereto, an enclosure 426 may include various gantries, catwalks, or the like that enable one or more human workers, robots, or the like to access the machines 410 (e.g., visually access, physical access) from above. This may be helpful when an enclosure 426 contains one or more large machines 410 where access from the edges or sides thereof may be insufficient for certain tasks.

Certain granular materials 144 may be chemically sensitive to the presence of oxygen (e.g., gaseous oxygen). For example, certain powders in an oxygenated environment pose a significant risk of explosion. Alternatively, or in addition thereto, oxygen may act as an oxidizing agent during a high temperature amalgamation of a granular material 144. The resulting oxidation may corrupt, harden, or otherwise adversely affect the structural and/or chemical properties of the part being manufactured.

Accordingly, in selected embodiments, an enclosure 426 may enable one or more machines 410 to operate in an environment with oxygen reduced below atmospheric levels. Such a low-oxygen environment can be formed by restricting an exchange of gaseous matter between an interior of the enclosure 426 and an exterior of the enclosure 426, while taking steps to remove or replace oxygen in the enclosure 426. In certain embodiments, this may be accomplished by making an enclosure 426 gas-tight or substantially gas-tight and filling the enclosure 426 with an inert or substantially inert gas such as nitrogen, argon, carbon-dioxide, other noble gas, or the like or a combination or sub-combination thereof. In other embodiment, the enclosure pressure can be lowered. Accordingly, an enclosure 426 may prevent or lower the risk of contamination due to oxidation and/or explosion due to reactivity of powdered materials. In selected embodiments, all of the various zones of a conveyor 420 may be contained within such an enclosure 426 (e.g., within a single enclosure 426).

In certain embodiments, a low oxygen environment may be an environment where the presence of gaseous oxygen is below a limiting oxygen concentration (LOC). The LOC may be defined as the limiting concentration of gaseous oxygen below which combustion is not possible regardless of the concentration of fuel. The LOC may vary with temperature, pressure, type of fuel (e.g., type of granular material 144), type of inert gas, and concentration of inert gas. The LOC corresponding to one enclosure 426 may be different than the LOC for another enclosure 426. Thus, the concentration of gaseous oxygen within any given enclosure 426 may be maintained below an LOC for that enclosure 426 (i.e., an LOC that takes into account the temperature, pressure, type of granular material 144, type of inert gas, and concentration of inert gas, etc. within that enclosure 426).

In other embodiments, a low oxygen environment may be an environment where the presence of gaseous oxygen is well below an LOC. For example, a low oxygen environment may correspond to gaseous oxygen levels at about 500 parts-per-million by volume or less, about 100 parts-per-million by volume or less, about 50 parts-per-million by volume or less, about 10 parts-per-million by volume or less, or about 1 parts-per-million by volume or less. Accordingly, in selected embodiments, a low oxygen environment in accordance with the present invention may be a substantially oxygen-free environment.

In certain embodiments, a manufacturing facility 424 may include one or more airlocks 428 forming one or more antechambers for a corresponding enclosure 426. An airlock 428 may enable parts, material 144, personnel, or the like to pass into and out of an enclosure 426 without compromising the environment (e.g., the low oxygen and inert gas environment) within the enclosure 426. An airlock 428 may include at least two airtight (or substantially airtight) doors 430a, 430b. A first door 430a of an airlock 428 may enable parts, materials 144, personnel, or the like to pass between the interior of the airlock 428 and the interior of the corresponding enclosure 426. A second door 430b may enable parts, materials 144, personnel, or the like to pass between the interior of the airlock 428 and an exterior environment surrounding the corresponding enclosure 426.

An airlock 428 may also include an gas exchange system (not shown) that may purge and/or vent the airlock 428 as desired or necessary to efficiently transition the gaseous environment within the airlock 428 between a state compatible with the interior of the enclosure 426 and a state compatible with the environment exterior to the enclosure 426.

In selected embodiments, the ratio of machines 410 within an enclosure 426 to airlocks 428 interfacing with the enclosure 426 may be greater than one to one (i.e., the number of machines 410 divided by the number of airlocks 428 may be greater than one). Accordingly, multiple machines 410 within an enclosure 426 may share an airlock 428. That is, methods in accordance with the present invention may include (1) removing from an enclosure 426 through an airlock 428 a first part manufactured by a first machine 410 in a first process of additive manufacture and (2) removing from the enclosure 426 through the airlock 428 a second part manufactured by a second machine 410 in a second process of additive manufacture, wherein the second processing being independent of the first process. In certain embodiments, the ratio of machines 410 within an enclosure 426 to airlocks 428 interfacing with the enclosure 426 may be two to one or greater (i.e., the number of machines 410 divided by the number of airlocks 428 may be greater than or equal to two).

In general, the larger the airlock 428, the more expensive it may be to operate in terms of time, equipment, materials, work, or the like. Accordingly, different airlocks 428 corresponding to a particular enclosure 426 may have different shapes and/or sizes. Thus, passing parts, material 144, personnel, or the like into and out of an enclosure 426 may include selected the best airlock 428 for the job.

For example, at least one relatively large airlock 428 corresponding to an enclosure 426 may be large enough (e.g., have a length, width, and height sufficient) to accommodate the largest part that will be manufactured by a machine 410 within the enclosure 426, while another relatively small airlock 428 corresponding to the enclosure 426 may be just large enough to accommodate personnel passing into and out of the enclosure 426. Accordingly, if a human worker needs to enter an enclosure, he or she may do so most efficiently by using the relatively small airlock 428.

In selected embodiments, one or more airlocks 428 may be quite small with respect to the overall size of a corresponding enclosure 426. Accordingly, those airlocks 428 may be operated without a gas exchange system. That is, the release of air into the interior of the enclosure 426 and/or the release of insert gas into the environment exterior to the enclosure 426 corresponding to each cycle of those airlocks 428 may be sufficiently small as to be negligible or at least within acceptable limits. Accordingly, those airlocks 428 may provide a quick and efficient mechanism for passing relatively small things into and out of a relatively large enclosure 426.

In certain embodiments, a manufacturing facility 424 may include one or more gas management systems 432 controlling the make-up of gaseous matter within an enclosure 426. A gas management system 432 may maintain concentrations of inert or substantially inert gas (e.g., nitrogen, argon, carbon-dioxide, or the like or a combination or sub-combination thereof) above a desired level (e.g., argon at or above about 99.9% by volume). Alternatively, or in addition thereto, a gas management system may maintain concentrations of oxygen and/or water vapor below atmospheric levels. For example, in one embodiment the desired levels can be below 0.05% by volume for gaseous oxygen, and below 0.05% by volume for water vapor.

In certain embodiments, a gas management system 432 may provide closed-loop recirculation of inert gas within an enclosure 426. However, if small amounts of inert gas escape from an enclosure 426 or are otherwise unrecoverable, a gas management system 432 may add more. Similarly, if small amounts of gaseous oxygen and/or water vapor infiltrate or are generated within an enclosure 426, a gas management system 432 may remove them. Thus, a gas management system 432 may be matched in capacity to a particular enclosure 426. In general, gas management systems 432 of larger capacity may be applied to enclosures 426 of larger size. However, the performance of a gas management system 432 may be balanced against the performance of the enclosure 426.

That is, in general, greater performance may be accompanied by greater cost. Accordingly, depending on various factors, it may be more cost effective to pay for greater performance of an enclosure 426 in order to lower the necessary performance of a gas management system 432. Conversely, it may be more cost effective to pay for greater performance of a gas management system 432 in order to lower the performance of an enclosure 426. Thus, an appropriate and cost-effective balance between the two interrelated systems 426, 432 may be reached.

In selected embodiments, a gas management system 432 may include one or more intake locations 434 and one or more outlet locations 436. A gas management system 432 may take in gas from within an enclosure 426 at one or more intake locations 434. A gas management system 432 may output gas into an enclosure 426 at one or more outlet locations 436. In certain embodiments, one or more outlet locations 436 may be proximate one or more machines 410 (e.g., directly over the print beds 146 of one or more machines 410) in order to provide a steady flow of inert gas thereto.

In certain embodiments, an enclosure 426 may include one or more windows 438. A window 438 may enable one or more persons outside an enclosure 426 to see and/or monitor what is happening inside the enclosure 426. Thus, one or more windows 438 may be important safety features of a manufacturing facility 424 in accordance with the present invention.

If desired or necessary, one or more windows 438 may be configured to filter out certain wavelengths of light that are incident thereon. For example, a window 438 may filter out certain wavelengths associated with one or more lasers of one or more machines 410 within an enclosure 426. Alternatively, or in addition thereto, a window 438 may filter out wavelengths associated with outside light that is attempting to enter an enclosure 426 thought the window 438. Thus, a window 438 may protect persons outside an enclosure 426 and/or photosensitive materials or items within the enclosure 426.

In certain embodiments, an enclosure 426 may be optically and/or thermally insulated. Optical insulation (e.g., radiation shielding) may prevent certain wavelengths (e.g., wavelengths corresponding to the lasers of one or more machines 410) may escaping an enclosure. Thermal insulation may be used to maintain (e.g., more easily maintain) a desired temperature within an interior of the enclosure 426. For example, certain processes of additive manufacture may require or run better at higher temperatures (e.g., temperatures greater than "room temperature" or greater than about 20 to about 25° C.). Such processes may themselves also generate significant heat. Accordingly, an enclosure 426 may be insulated in order to trap at least some of that heat.

An enclosure 426 in accordance with the present invention may be a building. Accordingly, in addition to restricting an exchange of gaseous matter between an interior of the enclosure 426 and an exterior of the enclosure 426, the walls of an enclosure 426 may provide a weather barrier. Alternatively, an enclosure 426 may be housed within a building. Accordingly, the walls, roof, etc. of the building may provide a weather barrier and leave the walls, ceiling, etc. of an enclosure 426 to deal exclusively with restricting an exchange of gaseous matter between an interior of the enclosure 426 and an exterior of the enclosure 426, reducing a flow of heat between an interior of the enclosure 426 and an exterior of the enclosure 426, or the like. This may free an enclosure 426 to be constructed with materials, shapes, methods, or the like that may be incompatible with a weather barrier.

An enclosure 426 in accordance with the present invention may be constructed in any suitable manner. For example, in selected embodiments, an enclosure 426 may include one or more walls, ceilings, floors, or the like defining a generally rectangular shape or generally rectangular sections of an overall shape. The floor may comprise concrete (e.g., a sealed concrete surface). The walls and/or ceiling may comprise modular metal sheets or panels that are bolted or otherwise fastened together. One or more sealants, gaskets, or the like may used between adjoining sheets or panels to provide a gas-tight or substantially gas-tight seal. Alternatively, or in addition thereto, one or more films, coatings, or the like may be used to provide a gas-tight or substantially gas-tight seal.

Figure 8:
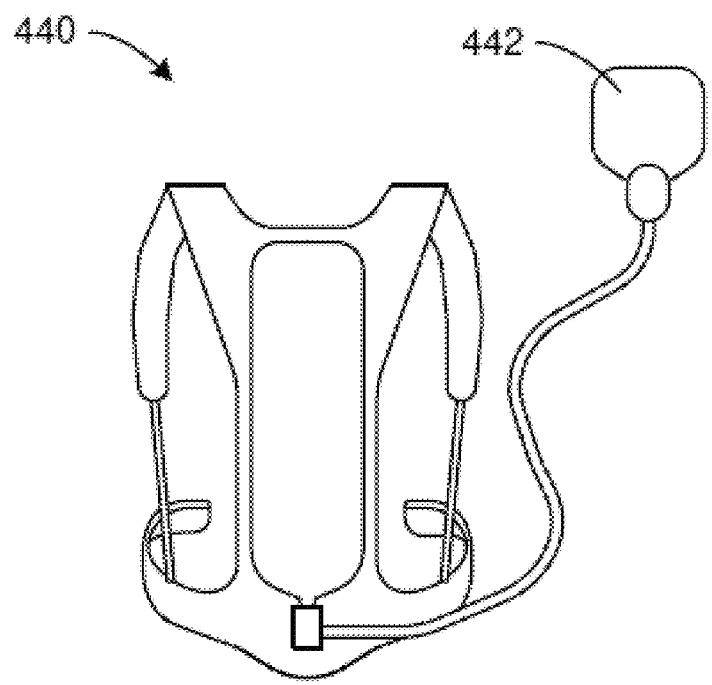
FIG. 8 is a schematic illustration of one embodiment of a self contained breathing apparatus that may be used by human works operating within (e.g., running, maintaining, and/or monitoring the machines within) the enclosures of FIGS. 6 and 7 in accordance with the present invention.

Referring to FIG. 8, the gaseous environment within an enclosure 426 may be incompatible with the respiratory requirements of one or more humans that may need to enter and/or work within the enclosure 426. Accordingly, to work within certain enclosures 426 in accordance with the present invention, one or more workers may don personal protective equipment (PPE). Thereafter, when the worker enters an enclosure 426, the PPE may create a barrier between the worker and the working environment within the enclosure 426.

In selected embodiments, the PPE worn by one or more workers may include a self-contained breathing apparatus (SCBA) 440. A SCBA 440 may be a closed circuit device that filters, supplements, and recirculates or stores exhaled gas (e.g., a rebreather). Alternatively, SCBA may be an open circuit device that exhausts at least some exhaled gas (e.g., nitrogen, carbon dioxide, oxygen, water vapor, or a combination or sub-combination thereof) into a surrounding environment. In embodiments where an open circuit device is used, the amount exhaled by the one or more workers within an enclosure 426 may be quite small with respect to the over size of the enclosure 426. Accordingly, the release of oxygen, water vapor, or the like into the interior of the enclosure 426 may be sufficiently small as to be negligible or at least within acceptable limits (e.g., within the capacity of a gas management system 432 to rectify).

In certain embodiments, a SCBA 440 may include a full face mask 442. If desired or necessary, such a mask 442 may be configured to filter out certain wavelengths of light that are incident thereon. For example, a mask 442 may filter out certain wavelengths associated with one or more lasers of one or more machines 410 within an enclosure 426. Thus, a mask 442 may protect a worker operating within an enclosure 426 from incidental laser exposure, which is typically due to reflections, but may be to a misaligned system or a system undergoing an alignment procedure.

In selected embodiments, the PPE worn by one or more workers within an enclosure 426 may protect the workers from potential thermal and/or laser exposure. For example, when operating in an environment for powder bed fusion, a worker may be exposed to high temperatures. Accordingly, the PPE for that worker may include a protective thermal suit (e.g., a suit that is or is like the structural turnout gear worn by firefighters), or may contain internal cooling and heat rejection.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An additive manufacturing system comprising:
   an enclosure restricting an exchange of gaseous matter between an interior of the enclosure and an exterior of the enclosure;
   a plurality of machines located within the enclosure, each machine of the plurality of machines comprising
   a separate powder bed,
   a material dispenser,
   one or more image relays,
   a control system programmed to control when the material dispenser distributes one or more layers of granules of a powder over the separate powder bed, and
   the control system further programmed to control when the one or more image relays direct radiant energy at selected granules within the one or more layers; and
   a gas management system maintaining gaseous oxygen within the enclosure below atmospheric level.

2. The system of claim 1, wherein the enclosure comprises an airlock interfacing between the interior and the exterior.

3. The system of claim 2, wherein the airlock comprises a first door, a second door, and a space located between the first door and the second door, the first door, second door, and space being sized to enable one or more humans to pass through the airlock.

4. The system of claim 1, wherein the gas management system maintains gaseous oxygen within the enclosure below a limiting oxygen concentration.

5. The system of claim 1, wherein the gas management system maintains gaseous oxygen within the enclosure below about 500 parts-per-million by volume.

6. The system of claim 1, wherein the enclosure comprises a floor comprising concrete.

* * * * *